United States Patent [19]
Nakano

[11] Patent Number: 5,808,531
[45] Date of Patent: Sep. 15, 1998

[54] VOLTAGE-CONTROLLED VARIABLE TUNING CIRCUIT

[75] Inventor: Kazuhiro Nakano, Fukushima-ken, Japan

[73] Assignee: Alps Electric Co., Ltd., Japan

[21] Appl. No.: 745,347

[22] Filed: Nov. 8, 1996

[30] Foreign Application Priority Data

Nov. 20, 1995 [JP] Japan ..................................... 7-301614

[51] Int. Cl.$^6$ ...................................................... H03J 5/00
[52] U.S. Cl. ......................... 334/15; 331/117 V; 334/56; 455/195.1
[58] Field of Search ................................ 334/1, 3, 15, 56; 331/177 V; 455/191.2, 193.3, 195.1, 197.2

[56] References Cited

U.S. PATENT DOCUMENTS

| | | | |
|---|---|---|---|
| 3,983,490 | 9/1976 | Ma .................................... | 334/15 X |
| 4,247,953 | 1/1981 | Shinagawa et al. ................ | 334/15 X |
| 5,534,825 | 7/1996 | Goma et al. ....................... | 331/117 R |
| 5,539,359 | 7/1996 | Goma ................................. | 331/117 D |

Primary Examiner—Paul Gensler
Attorney, Agent, or Firm—Brinks Hofer Gilson & Lione

[57] ABSTRACT

A tuning circuit is formed of inductors connected in series, voltage-controlled variable capacitance means connected in parallel to the inductors, switch means connected in parallel to one of the inductors and capacitance means connected in parallel to another of the inductors, and the resonance frequency of a resonant circuit of the inductor and the capacitance means is set higher than the resonance frequency of the tuning circuit. When the switch means is turned off to change the frequency of the -tuning circuit to the lower frequency band, the frequency variable ratio of the tuning circuit becomes large and when the switch means is turned on to change the frequency to the higher frequency band, such frequency variable ratio becomes small, and the frequency variable width of the lower frequency band can be set almost equal to the frequency variable width of the higher frequency band by adequately selecting the capacitance of the capacitance means.

2 Claims, 5 Drawing Sheets

FIG. 3

| | OSCILLATING FREQUENCY BAND | FIG. | OSCILLATING FREQUENCY (MHz) MIN. | OSCILLATING FREQUENCY (MHz) MAX. | FREQUENCY VARIABLE WIDTH (MHz) | SENSITIVITY (MHz/V) |
|---|---|---|---|---|---|---|
| PRESENT INVENTION | LOWER SIDE (DURING RECEPTION) | FIG. 2B | 1755.52 | 1798.42 | 42.90 | 21.450 |
| | HIGHER SIDE (DURING TRANSMISSION) | FIG. 2C | 1869.36 | 1912.35 | 42.99 | 21.495 |
| PRIOR ART | LOWER SIDE (DURING RECEPTION) | FIG. 5B | 1758.61 | 1799.04 | 40.43 | 20.215 |
| | HIGHER SIDE (DURING TRANSMISSION) | FIG. 5C | 1869.36 | 1912.35 | 42.99 | 21.495 |

5,808,531

VOLTAGE-CONTROLLED VARIABLE TUNING CIRCUIT

BACKGROUND OF THE INVENTION

1. Field of the Invention

The present invention relates to a voltage-controlled variable tuning circuit and particularly to a voltage-controlled variable tuning circuit where the tuning circuit is used for a couple of frequency bands through the changeover operation by switch means and a difference of tuning frequencies of a couple of frequency bands is set constant when the tuning control voltage is changed within a constant variable range.

2. Description of the Related Art

In general, when the frequency band used is to be changed in a voltage-controlled variable tuning circuit comprising at least one inductor and one capacitor, an inductance value L of the inductor is changed step by step using switch means and when the tuning (resonance) frequency is selected in respective frequency bands, a capacitance value C of voltage-controlled variable capacitance means is changed with a tuning control voltage.

FIG. 4 is a circuit structure diagram showing an example of the known voltage-controlled variable tuning circuit which is connected to an oscillating circuit to form an oscillator.

As shown in FIG. 4, the voltage-controlled variable tuning circuit 31 has a connecting point A, a connecting point B, a connecting point C and a connecting point D. Among these connecting points, the connecting point A is connected to a tuning control voltage supply terminal 33 via a first buffer resistor 32, the connecting point B is connected to an oscillating circuit 34 and the connecting point C is connected to a frequency band changeover voltage supply terminal 36 via a second buffer resistor 35. In this case, the voltage-controlled variable tuning circuit 31 comprises a variable capacitance diode 37 connected between the connecting point A and the reference voltage point (ground point), a series capacitor 38 connected between the connecting point A and the connecting point B, a first capacitor 39 connected between the connecting point B and the reference voltage point, a first inductor, for example, a first microstrip line 40 connected between the connecting point B and the connecting point D, a second inductor, for example, a second microstrip line 41 connected between the connecting point D and the reference voltage point, a second capacitor 42 for blocking the DC element connected between the connecting point C and the connecting point D, and a switching diode 43 for band switching connected between the connecting point C and the reference voltage point. Moreover, the oscillating circuit 34 is provided with an oscillation transistor 44 and is connected between an oscillation signal output terminal 45 and a power supply terminal 46.

FIGS. 5A to 5C show a circuit diagram showing only an extracted part of the structure of the voltage-controlled variable tuning circuit 31; FIG. 5A shows a total structure diagram, FIG. 5B shows an equivalent circuit diagram when the frequency band is switched to the lower frequency band and FIG. 5C shows an equivalent circuit diagram when the frequency band is switched to the higher frequency band.

Here, operations of the voltage-controlled variable tuning circuit 31 related to the structure explained above will be explained with reference to FIGS. 5A to 5C.

First, when a negative DC voltage is applied to the frequency band changeover voltage supply terminal 36, the switching diode 43 becomes off and the voltage-controlled variable tuning circuit 31 is switched to the lower frequency band. In this case, the voltage-controlled variable tuning circuit 31 changes to the condition shown in FIG. 5B from the condition shown in FIG. 5A. An equivalent variable capacitance circuit 47 consisting of a series connecting circuit of the variable capacitance diode 37 and a series capacitor 38, a series connecting circuit of the first and second inductors 40, 41 and the first capacitor 39 are connected in parallel between the connecting point B and the reference voltage point.

The variable capacitance diode 37 changes its capacitance value with a tuning control voltage supplied to the tuning control voltage supply terminal 33. Thereby, the equivalent capacitance of the equivalent variable capacitance circuit 47 changes to set the resonance frequency of the voltage-controlled variable tuning circuit 31. Here, a capacitance variable ratio, namely, a frequency variable ratio of the voltage-controlled variable tuning circuit 31 when the tuning control voltage is changed is determined by the equivalent capacitance of the equivalent variable capacitance circuit 47 and the capacitance of the first capacitor 39.

Next, when a positive DC voltage is applied to the frequency band changeover voltage supply terminal 36, the switching diode 43 turns on and the voltage-controlled variable tuning circuit 31 is switched to the higher frequency band. In this case, the voltage-controlled variable tuning circuit 31 changes to the condition shown in FIG. 5C from the condition shown in FIG. 5B because the connecting point D and the reference voltage point are short-circuited for the higher frequency element through the second capacitor 42 and switching diode 43. Thereby, the equivalent variable capacitance circuit 47 consisting of the series connecting circuit of the variable capacitance diode 37 and series capacitor 38, first inductor 40 and first capacitor 39 are connected in parallel between the connecting point B and the reference voltage point.

The variable capacitance diode 37 changes its capacitance when the tuning control voltage is applied to the tuning control voltage supply terminal 33. Thereby, the equivalent variable capacitance circuit 47 changes its equivalent capacitance to set the tuning frequency of the voltage-controlled variable tuning circuit 31. In this case, the capacitance variable ratio, namely, the frequency variable ratio of the voltage-controlled variable tuning circuit 31 when the tuning control voltage is changed is determined by the equivalent capacitance of the equivalent variable capacitance circuit 47 and the capacitance of the first capacitor 39.

In the case of a cordless telephone set, one oscillator is sometimes used in common as a local oscillator in the receiving side and a carrier oscillator in the transmitting side. For instance, in the cordless telephone set of the DECT system, the common oscillator is operated as the carrier oscillator for the transmission to set a communication channel by oscillating one carrier frequency within the range from 1881.8 MHz (FTmin) to 1897.3 MHz (FTmax). On the other hand, for the reception, the common oscillator is operated as the local oscillator for conversion of receiving signal frequency by oscillating one local oscillation frequency within the range from 1769.5 MHz (FRmin) which is lowered by 112.3 MHz than the carrier frequency to 1785.0 MHz (FTmax). Such common oscillator uses the voltage-controlled variable tuning circuit 31 as explained above for the tuning circuit and changes the oscillation frequency band to the higher or lower frequency band corresponding to the switching of the transmission and reception mode to select the channel corresponding to the desired oscillation frequency in the respective frequency bands.

The common oscillator used in the cordless telephone set of the DECT system described above provides, when the inductance value L of the inductor in the tuning circuit is changed step by step to change over the oscillation frequency band, different frequency variable width (FRmax—FRmin or FTmax—FTmin) in the oscillation frequency band which changes proportional to the frequency in the frequency band because the frequency variable ratios in the respective frequency bands are constant (FRmax/FRmin= FTmax/FTmin).

Namely, when the oscillation frequency band of the common oscillator is to be changed to the lower band (for the reception) from the higher band (for the transmission), if the oscillation frequency band is changed in the channel corresponding to the lowest frequency to set the frequency 1769.5 MHz (FRmin) for the reception which is lowered by 112.3 MHz from the frequency 1881.8 MHz (FTmin) for the transmission, the frequency 1897.3 MHz (FTmax) for the transmission must intrinsically be changed to the frequency 1785.0 MHz (FRmax) for the reception in the channel corresponding to the maximum frequency. In this case, however, such frequency for the transmission is changed to 1784.1 MHz [1769.5 MHz (FRmin)×{1897.3 MHz (FTmax) /1881.8 MHz (FTmin)}]. Thereby the frequency difference for the transmission and reception is not equal to 112.3 MHz and is increased to 113.2 MHz (1897.3 MHz−1784.1 MHz).

As described above, when the oscillation frequency band of the common oscillator is to be changed to the lower band (for the reception) from the higher band (for the transmission), if the variable ranges of the tuning control voltages in both oscillation frequency bands are matched, the frequency difference for the transmission and reception changes depending on the frequency corresponding to the selected channel.

However, when the oscillation frequency band of the common oscillator is to be changed to the lower band (for the reception) from the higher band (for the transmission), the frequency difference between the transmission and reception modes can be eliminated, without relation to the frequency corresponding to the selected channel, by changing the tuning control voltage at the time of changing over the transmission mode and reception mode.

Here, it should be noted that the voltage-controlled variable tuning circuit having such structure described above has a problem that a compensating circuit and switching circuit having complicated structure are required in the tuning control voltage generating circuit.

Particularly, the cordless telephone set of the time division duplex (TDD) communication system as well as the DECT system explained above repeats the transmission and reception in every several milliseconds. Therefore when the known voltage-controlled variable tuning circuit of the structure explained above is used for the cordless telephone set operating as explained above, the tuning control voltage must be changed in every period as short as several milliseconds. However, since the known voltage-controlled variable tuning circuit of the structure explained above uses a compensating circuit of complicated structure, it is very difficult from the technical viewpoint to change over the tuning control voltage in every short period of time.

SUMMARY OF THE INVENTION

The present invention has been proposed to overcome these problems and it is therefore an object of the present invention to provide a voltage-controlled variable tuning circuit which does not use a complicated compensating circuit for generation of a tuning control voltage and almost equalizes the frequency difference without relation to the selected frequency band at the time of changing over the oscillation frequency band.

In view of achieving the object explained above, the present invention comprises a tuning circuit composed of first and second inductors connected in series, voltage-controlled variable capacitance means connected in parallel to the first and second inductors, switch means for band switching connected in parallel to the second inductor and first capacitance means connected in parallel to the first inductor, and also comprises means for setting the resonance frequency of a resonant circuit consisting of the first inductor and first capacitance means to become higher than the resonance frequency of the tuning circuit.

In the means explained above, when the switch means for band switching is turned off to set the voltage-controlled variable tuning circuit for the lower frequency band, the variable ratio of the capacitance of the voltage-controlled variable tuning circuit is equal to the variable ratio of the capacitance (CVmax/CVmin) of the voltage-controlled variable capacitance means because the first capacitance means only changes the equivalent inductance of the first inductor and does not contribute as the capacitance of the voltage-controlled variable tuning circuit. Here, CVmax, CVmin indicate the capacitances of the voltage-controlled variable capacitance means when the maximum and minimum tuning control voltages are applied.

Meanwhile, when the switch means for band switching is turned on for setting the voltage-controlled variable tuning circuit to the higher frequency band, the capacitance value C of the first capacitance means is added to the capacitance of the voltage-controlled variable capacitance means and the variable ratio of the capacitance of the voltage-controlled variable tuning circuit becomes equal to {(CVmax+C)/ (CVmin+C)} which is smaller than the variable ratio (CVmax/CVmin) in such a case that the first capacitance means is not connected, because the first capacitance means is connected in parallel to the voltage-controlled variable capacitance means.

As described above, since the frequency variation corresponding to change of the same tuning control voltage is different when the first capacitance means is connected in parallel to the voltage-controlled variable capacitance means and when it is not connected in parallel, when the capacitance value C of the first capacitance means is selected desirably, the frequency difference when the tuning circuit is switched to the lower frequency band or higher frequency band can be set almost equal without relation to the selected frequency.

BRIEF DESCRIPTION OF THE DRAWINGS

FIG. 3 is a characteristic diagram showing various operating characteristics when the voltage-controlled variable tuning circuit is used for a common oscillator of a cordless telephone set;

DESCRIPTION OF THE PREFERRED EMBODIMENT

A preferred embodiment of the present invention will be explained in detail with reference to the accompanying drawings.

Figure 1:
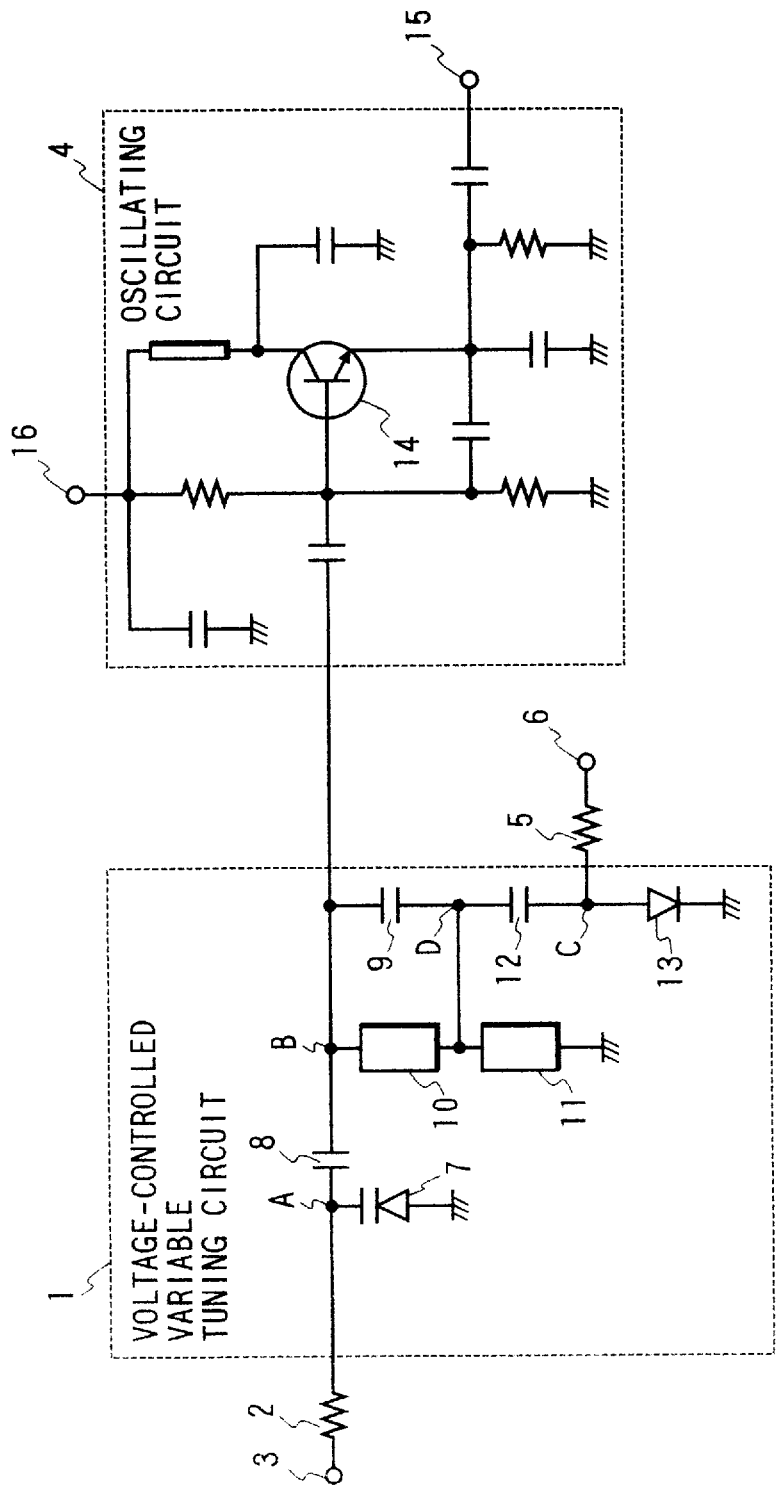
FIG. 1 is a circuit structure diagram showing a preferred embodiment of a voltage-controlled variable tuning circuit of the present invention.

FIG. 1 is a circuit structure diagram showing a preferred embodiment of a voltage-controlled variable tuning circuit in relation to the present invention, which is an example of forming an oscillator through connection with an oscillating circuit.

As shown in FIG. 1, the voltage-controlled variable tuning circuit 1 has a connecting point A, a connecting point B, a connecting point C and a connecting point D. Of these connecting points, the connecting point A is connected to a tuning control voltage supply terminal 3 via a first buffer resistor 2, the connecting point B is connected to the oscillation circuit 4 and the connecting point C is connected to a frequency band changeover voltage supply terminal 6 via a second buffer resistor 5. Moreover, the voltage-controlled variable tuning circuit 1 comprises a variable capacitance diode (voltage-controlled variable capacitance means) 7 connected between the connecting point A and the reference voltage point (ground point), a series capacitor 8 connected between the connecting point A and the connecting point B, a first capacitor (first capacitance means) 9 and a first microstrip line (first inductor) 10 connected in parallel between the connecting point B and the connecting point D, a second microstrip line (second inductor) 11 connected between the connecting point D and the reference voltage point, a second capacitor 12 for blocking DC element connected between the connecting point C and the connecting point D and a switching diode (switching means for changing the frequency band) 13 connected between the connecting point C and the reference voltage point. The oscillation circuit 4 is provided with a transistor 14 connected to an oscillation signal output terminal 15 and a power supply terminal 16. In this case, the parallel connecting circuit of the first capacitor 9 and the first microstrip line 10 of the voltage-controlled variable tuning circuit 1 has the capacitance value of the first capacitor 9 and the inductance value of the first microstrip line 10 so that the resonance frequency becomes higher than the resonance frequency of the voltage-controlled variable tuning circuit 1.

Figure 2A:
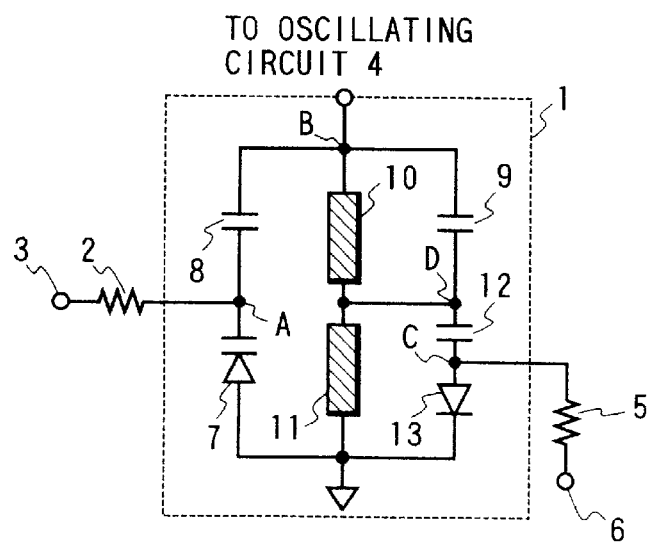
FIGS. 2A to 2C show a circuit diagram and equivalent circuit diagram extracting only the structure of the voltage-controlled variable tuning circuit shown in FIG. 1.
Figure 2B:
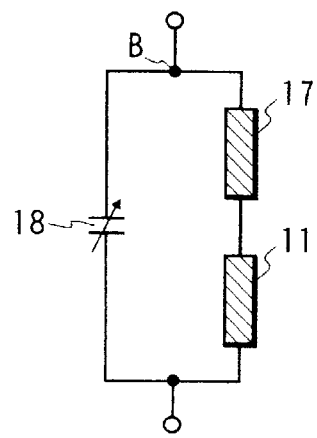
Figure 2C:
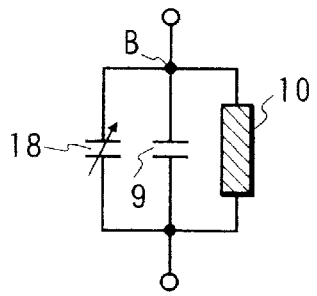

Moreover, FIGS. 2A to 2C show a circuit diagram showing an extracted structure of the voltage-controlled variable tuning circuit 1; FIG. 2A is a total circuit structural diagram, FIG. 2B is an equivalent circuit diagram when the frequency is changed to the lower frequency band and FIG. 2C is an equivalent circuit diagram when the frequency is changed to the higher frequency band.

Operations of the voltage-controlled variation tuning circuit 1 of the structure explained above will be explained with reference to FIGS. 2A to 2C.

First, when a negative DC-voltage is applied to the frequency band changeover voltage supply terminal 6, the switching diode 13 turns off and the voltage-controlled variable tuning circuit 1 is set to the lower frequency band. In this case, the parallel connecting circuit as a whole consisting of the first capacitor 9 and the first microstrip line 10 functions as an equivalent inductor 17 since the resonance frequency is set as explained above. The voltage-controlled variable tuning circuit 1 is changed to the condition shown in FIG. 2B from the condition shown in FIG. 2A, connecting in parallel an equivalent variable capacitance circuit 18 consisting of the series connecting circuit of the variable capacitance diode 7 and the series capacitor 8 and the series connecting circuit of the equivalent inductor 17 and the second microstrip line 11 between the connecting point B and the reference voltage point. The capacitance of the variable capacitance diode 7 is changed by the tuning control voltage supplied to the tuning control voltage supply terminal 3 and thereby the equivalent capacitance of the equivalent variable capacitance circuit 18 also changes, setting the tuning frequency of the voltage-controlled variable tuning circuit 1. In this case, the capacitance variable ratio, that is, the frequency variable ratio of the voltage-controlled variable tuning circuit 1 when the tuning control voltage is changed is determined only by the equivalent capacitance of the equivalent variable capacitance circuit 18.

Next, when a positive DC voltage is applied to the frequency band changeover voltage supply terminal 6, the switching diode 13 turns on and the voltage-controlled variable tuning circuit 1 is set to the higher frequency band. In this case, the voltage-controlled variable tuning circuit 1 short-circuits for the high frequency element between the connecting point D and the reference voltage point with the second capacitor 12 and switching diode 13 and changes to the condition shown in FIG. 2C from the condition shown in FIG. 2B, connecting in parallel the equivalent variable capacitance circuit 18, first microstrip line 10 and first capacitor 9 between the connecting point B and the reference voltage point. Moreover, the capacitance of the variable capacitance diode 7 changes due to the tuning control voltage supplied to the tuning control voltage supply terminal 3 and thereby the equivalent capacitance of the equivalent variable capacitance circuit 18 also changes, setting the tuning frequency of the voltage-controlled variable tuning circuit 1. In this case, the capacitance variable ratio, namely, the frequency variable ratio of the voltage-controlled variable tuning circuit 1 when the tuning control voltage is changed is determined by the equivalent capacitance of the equivalent variable capacitance circuit 18 and the capacitance of the first capacitor 9.

As described above, according to the voltage-controlled variable tuning circuit 1 depending on the preferred embodiment of the present invention, its frequency variable ratio becomes large when the frequency is changed to the lower frequency band, while becomes small when the frequency is changed to the higher frequency band. Therefore, the frequency variable width in the lower frequency band can be set almost equal to the frequency variable width in the higher frequency band because the capacitance value of the first capacitor 9 is selected adequately. Therefore, the common tuning control voltage can be used for both lower and higher frequency bands and a compensating circuit of complicated structure which has been used in the known voltage-controlled variable tuning circuit can no longer be required for generation of the tuning control voltage.

In the embodiment explained above, the microstrip lines 10, 11 are used for the first and second inductors, but the voltage-controlled variable tuning circuit 1 of the present invention is not limited to that using the microstrip line and can also be applied to that using an ordinary high frequency inductor or the like.

Figure 4:
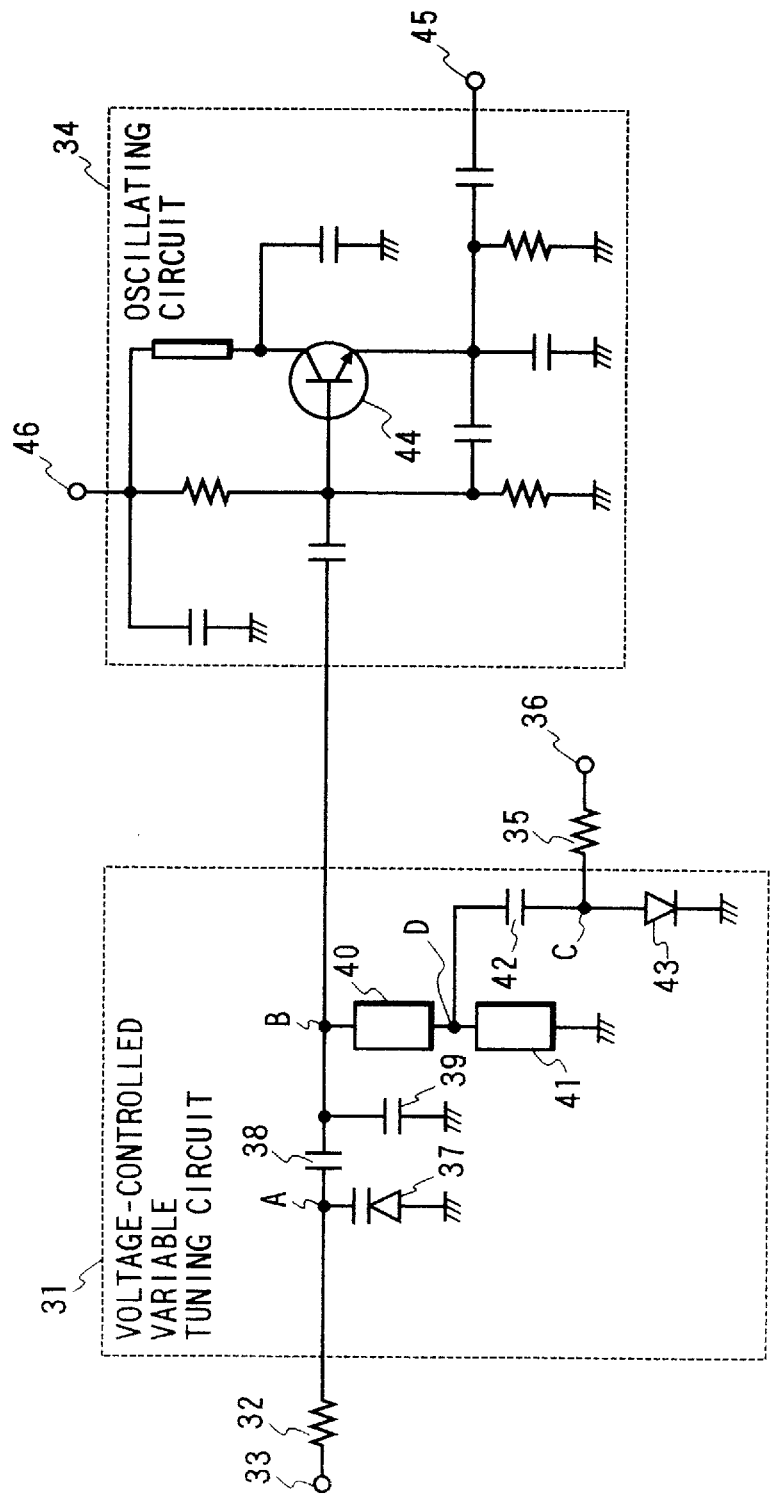
FIG. 4 is a circuit structure diagram showing an example of a known voltage-controlled variable tuning circuit.
Figure 5A:
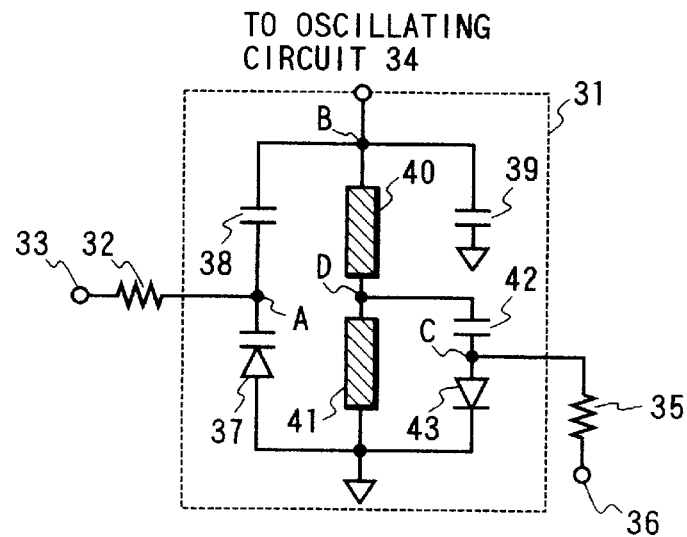
FIGS. 5A to 5C show a circuit diagram and equivalent circuit diagram showing extracted structure of the voltage-controlled variable tuning circuit shown in FIG. 4.
Figure 5B:
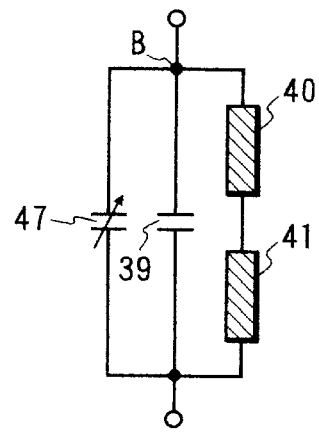
Figure 5C:
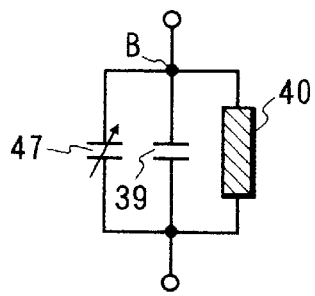

Subsequently, FIG. 3 is a characteristic diagram showing various operating characteristics in the case where the voltage-controlled variable tuning circuit 1 of the preferred embodiment of the present invention is used for the common oscillator of the cordless telephone set explained above, for comparison with the various operation characteristics in the case where the known voltage-controlled variable tuning circuit 31 shown in FIG. 4 is used for the common oscillator of the similar cordless telephone set.

In this case, in the voltage-controlled variable tuning circuit 1, capacitance of the series capacitor 8 is 3 pF, capacitance of the first capacitor 9 is 2 pF, variable range of capacitance of the variable capacitance diode 7 is 15 to 9.9 pF, inductance of the first microstrip line 10 is 1.61 nH, and inductance of the second microstrip line 11 is 0.21 nH. Moreover, in the voltage-controlled variable tuning circuit 31, capacitance of the series capacitor 38 is 3 pF, capacitance of the first capacitor 39 is 2 pF, variable range of capacitance of the variable capacitance diode 37 is 15 to 9.9 pF, inductance of the first microstrip line 40 is 1.61 nH and inductance of the second microstrip line 41 is 0.28 nH, and the variable range of the tuning control voltage supplied to both voltage-controlled variable tuning circuits 1, 31 is selected to 0.5 (minimum oscillation frequency) to 2.5 V (maximum oscillation frequency).

When the known voltage-controlled variable tuning circuit 31 is used as shown in FIG. 3, it can be understood that the frequency variable width shows the difference of about 2.5 MHz at 40.43 MHz for the lower oscillation frequency band and 42.99 MHz for the higher oscillation frequency band, and, on the other hand, when the voltage-controlled variable tuning circuit 1 depending on the preferred embodiment of the present invention is used, the same frequency variable width is 42.90 MHz for the lower oscillation frequency band and 42.99 MHz for the higher oscillation frequency band.

As explained in detail above, the voltage-controlled variable tuning circuit 1 of the present invention provides the effect that since the frequency variable ratio becomes large when the frequency is changed to the lower frequency band but the frequency variable ratio becomes small when the frequency is changed to the higher frequency band, the frequency variable width in the lower frequency band can be set almost equal to that in the higher frequency band by adequately selecting the capacitance value of the first capacitor 9.

Moreover, the voltage-controlled variable tuning circuit 1 of the present invention also provides the effect that the common tuning control voltage may be used for both lower and higher frequency bands and the compensating circuit of complicated structure which has been used for the known voltage-controlled variable tuning circuit can no longer be required for generation of the tuning control voltage.

What is claimed is:

1. A voltage-controlled variable tuning circuit characterized in that the tuning circuit is comprised of a first inductor having a first terminal and a second terminal, a second inductor having first and second terminals, the second terminal of said first inductor being connected to the first terminal of said second inductor, the second terminal of said second inductor being connected to a reference voltage terminal, a voltage-controlled variable capacitance means having a first terminal connected to said first terminal of said first inductor and a second terminal connected to said reference voltage terminal, a band changeover switch means connected in parallel to said second inductor, and a first capacitance means coupled in parallel to only said first inductor.

2. A voltage-controlled variable tuning circuit as set forth in claim 1, characterized in that said first and second inductors are-formed of microstrip line, said voltage-controlled variable capacitance means is formed of a variable capacitance diode and said band changeover switch means is composed of a switching diode.

\* \* \* \* \*

UNITED STATES PATENT AND TRADEMARK OFFICE
CERTIFICATE OF CORRECTION

PATENT NO.   : 5,808,531
DATED        : September 15, 1998
INVENTOR(S)  : Kazuhiro Nakano It is certified that error appears in the above-indentified patent and that said Letters Patent is hereby corrected as shown below:

On the Title Page

In column 2, line 9, under "ABSTRACT" replace "-tuning" with --tuning--.

Signed and Sealed this

Twenty-third Day of March, 1999

Attest:

Attesting Officer

Q. TODD DICKINSON

Acting Commissioner of Patents and Trademarks